(12) United States Patent
Lim et al.

(10) Patent No.: US 7,570,144 B2
(45) Date of Patent: Aug. 4, 2009

(54) INTEGRATED TRANSFORMER AND METHOD OF FABRICATION THEREOF

(75) Inventors: Chee Chong Lim, Singapore (SG); Kok Wai Chew, Singapore (SG); Kiat Seng Yeo, Singapore (SG); Suh Fei Lim, Singapore (SG); Manh Anh Do, Singapore (SG); Lap Chan, Singapore (SG)

(73) Assignees: Chartered Semiconductor Manufacturing, Ltd., Singapore (SG); Nanyang Technological University, Singapore (SG)

( * ) Notice: Subject to any disclaimer, the term of this patent is extended or adjusted under 35 U.S.C. 154(b) by 0 days.

(21) Appl. No.: 11/750,341

(22) Filed: May 18, 2007

(65) Prior Publication Data

US 2008/0284552 A1 Nov. 20, 2008

(51) Int. Cl.
*H01F 5/00* (2006.01)
(52) U.S. Cl. ..................................... 336/200
(58) Field of Classification Search ................ 336/200, 336/232, 223, 65, 83; 257/531
See application file for complete search history.

(56) References Cited

U.S. PATENT DOCUMENTS

| | | | |
|---|---|---|---|
| 6,031,445 A | 2/2000 | Marty et al. | |
| 6,114,937 A | 9/2000 | Burghartz et al. | |
| 6,476,704 B2 * | 11/2002 | Goff | 336/200 |
| 6,635,949 B2 * | 10/2003 | Lowther et al. | 257/531 |
| 6,825,749 B1 * | 11/2004 | Lin et al. | 336/200 |
| 7,068,140 B2 * | 6/2006 | Chou | 336/200 |
| 7,164,339 B2 * | 1/2007 | Huang | 336/200 |
| 2001/0050607 A1 | 12/2001 | Gardner | |
| 2003/0071706 A1 | 4/2003 | Christensen | |
| 2003/0229982 A1 | 12/2003 | Vilander et al. | |
| 2004/0017278 A1 | 1/2004 | Castaneda et al. | |

(Continued)

FOREIGN PATENT DOCUMENTS

DE 10261385 7/2004

(Continued)

OTHER PUBLICATIONS

John R. Long, Monolithic Transformers for Silicon RF IC Design, IEEE Journal of Solid-State Circuits, vol. 35, No. 9, Sep. 2000, pp. 1368-1382.

(Continued)

*Primary Examiner*—Tuyen T. Nguyen
(74) *Attorney, Agent, or Firm*—Horizon IP Pte Ltd

(57) ABSTRACT

An integrated transformer structure includes a first coil element associated with a transverse axis, the first coil element having at least one turn. The first coil element includes a first portion provided on a first lateral level, and a second portion provided on a second lateral level. The first and second lateral levels being mutually spaced apart along said transverse axis. The first and second portions being displaced laterally from said axis by different respective distances. At least one crossover portion of the first coil element, in which the first coil element being configured to provide a conducting path through at least a portion of the first portion of the first coil element to the crossover portion, through the crossover portion and subsequently through at least a portion of the second portion of the first coil element, in which any change of flow direction along said path is less than 90° in a lateral direction.

32 Claims, 18 Drawing Sheets

U.S. PATENT DOCUMENTS

| | | | |
|---|---|---|---|
| 2004/0046630 | A1 | 3/2004 | Gardner |
| 2004/0056749 | A1 | 3/2004 | Kahlmann et al. |
| 2004/0095222 | A1 | 5/2004 | Liang et al. |
| 2005/0128038 | A1 | 6/2005 | Hyvonen |

FOREIGN PATENT DOCUMENTS

| | | |
|---|---|---|
| EP | 0649152 A2 | 8/1990 |
| GB | 2381129 | 4/2003 |
| WO | 0146971 A1 | 6/2001 |
| WO | 02065492 A2 | 8/2002 |

OTHER PUBLICATIONS

Jianjun J. Zhou, Monolithic Transformers and Their Application in a Differential CMOS RF Low-Noise Amplifier, IEEE Journal of Solid-State Circuits, vol. 33, No. 12, Dec. 1998, pp. 2020-2027.

Sunderarajan S. Mohan, Modeling and Characterization of On-Chip Transformers, 1998 International Electron Devices Meeting Technical Digest, Dec. 1998, pp. 531-534.

Ichiro Aoki, Fully Integrated CMOS Power Amplifier Design Using the Distributed Active-Transformer Architecture, IEEE Journal of Solid-State Circuits, vol. 37, No. 3, Mar. 2002, pp. 371-383.

John R. Long, The Modeling, Characterization, and Design of Monolithic Inductors for Silicon RF IC's, IEEE Journal of Solid-State Circuits, vol. 32, No. 3, Mar. 1997, pp. 357-369.

Yo-Sheng Lin, Temperature-Dependance of Noise Figure of Monolithic RF Transformers on a Thin (20 um) Silicon Substrate, IEEE Electron Device Letters, vol. 26, No. 3, Mar. 2005, pp. 208-211.

Sang-Gug Lee, Area Efficient and Symmetric Design of Monolithic Transformers for Silicon RF ICs, TENCON 99. Proceedings of the IEEE Region 10 Conference, vol. 2, Dec. 1999, pp. 880-882.

* cited by examiner (a) (b)

(a)          (b)

P: Primary Coil
S: Secondary Coil

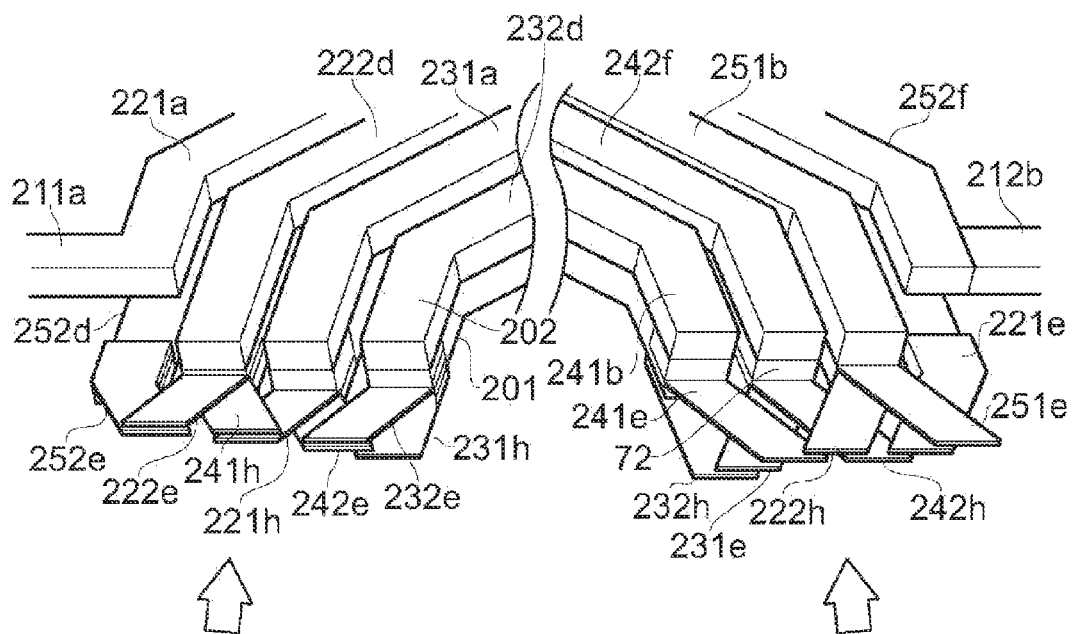
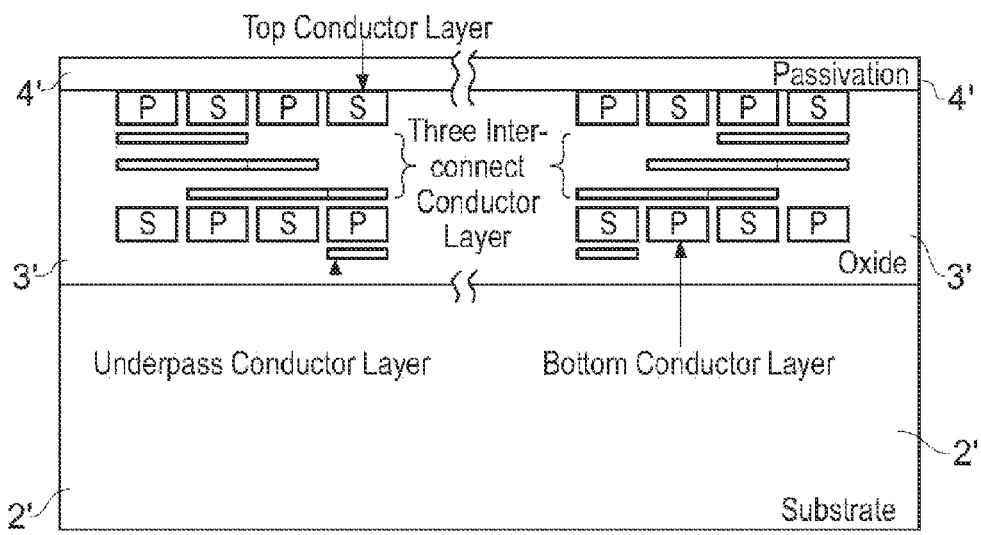
P: Primary Coil
S: Secondary Coil
Fig. 11a                    Fig. 11b

INTEGRATED TRANSFORMER AND METHOD OF FABRICATION THEREOF

FIELD OF THE INVENTION

The present invention relates to integrated transformers for semiconductor integrated circuit structures, and to a method of fabricating an integrated transformer.

BACKGROUND OF THE INVENTION

Monolithic transformers are used in on-chip radio frequency (RF) integrated circuits (ICs) to perform a range of functions including impedance matching, signal coupling and phase splitting. Monolithic transformers provide a number of advantages for the circuit designer over conventional transformers including lower power consumption and higher packaging density. Monolithic transformers enable power amplifiers to be fabricated by standard CMOS processes. However, power levels obtainable based on existing fully integrated amplifiers using silicon as the substrate are too low to be considered for wireless applications. This is due to power losses caused by eddy currents induced in the silicon substrate by electromagnetic fields associated with coils of the transformer.

In order to reduce power losses, a variety of fabrication methods have been proposed including special wafer-processing techniques including thinning of the silicon substrate. This technique is costly, however, and not readily compatible with foundry processing technologies. Furthermore, additional costs are associated with this technique.

Current fabrication techniques for monolithic transformer structures result in the primary and secondary coils being formed to have unequal physical lengths, resulting in a difference between the values of inductance of the coils. Furthermore, in the case of stacked transformer structures, differences in metallization thicknesses and distances between respective coils and the silicon substrate also cause discrepancies in transformer performance.

Examples of known integrated transformer structures include planar transformer structures that rely on coupling between coils located primarily in the same plane, ie lateral (or 'side') coupling between coils. US2003/0071706 discloses such a structure.

FIGS. 1(a) and (b) show prior art transformer structures of the planar and stacked type, respectively. The structures show transformers having, respectively, two and four turns per primary and secondary coil. FIGS. 2(a) and (b) are exploded views of the structures of FIGS. 1(a) and (b) respectively.

Planar transformers rely on coupling between coils in a lateral (or 'horizontal') direction. Structures of the stacked type rely on coupling between coils located in parallel spaced apart planes, i.e. transverse (or 'vertical') coupling. US2004/0056749 discloses structures of the stacked type.

Lee (S.-G. Lee, "Area efficient and symmetric design of monolithic transformers for silicon RF ICs," Proceedings of the IEEE Region 10 Conference, 1999, pages 880-882) proposed an integrated transformer structure having the feature of mixed coupling between primary and secondary coils. The structure proposed by Lee exhibits side-coupling (hereinafter referred to as 'lateral coupling') and vertical-coupling (hereinafter referred to as 'transverse coupling'). Mixed coupling was suggested to provide the best performance in terms of symmetry, area efficiency and insertion loss.

The performance of mixed coupling devices is generally better than that of devices relying on only lateral or transverse coupling between coils. However, further improvements in transformer performance are highly desirable.

SUMMARY OF THE INVENTION

It is an aim of embodiments of the present invention to at least partly mitigate the above mentioned problems.

It is a further aim of embodiments of the invention to provide an improved integrated transformer structure.

Another aim of embodiments of the present invention is to provide a fabrication method for an improved integrated transformer structure.

A still further aim of embodiments of the present invention is to provide an integrated transformer having increased power efficiency. It is a further aim of embodiments of the invention to provide a transformer having increased power efficiency that is compatible with standard CMOS deep-submicron fabrication processes.

According to a first aspect of the present invention there is provided an integrated transformer structure, comprising:

a first coil element associated with a transverse axis, the first coil element having at least one turn, the first coil element comprising a first portion provided on a first lateral level, and a second portion provided on a second lateral level, the first and second lateral levels being mutually spaced apart along said transverse axis, the first and second portions being displaced laterally from said axis by different respective distances; and at least one crossover portion of the first coil element, the first coil element being configured to provide a conducting path through at least a portion of the first portion of the first coil element to the crossover portion, through the crossover portion and subsequently through at least a portion of the second portion of the first coil element, in which any change of flow direction along said path is less than 90° in a lateral direction.

According to a second aspect of the invention there is provided an integrated transformer structure, comprising: first and second coil elements associated with a transverse axis, each coil element having at least one turn, each coil element comprising a first portion provided on a first lateral level, and a second portion provided on a second lateral level, the first and second lateral levels being mutually spaced apart along said transverse axis, the first and second portions being displaced laterally from said axis by different respective distances, each coil element further comprising at least one crossover portion, said coil elements being configured to provide a conducting path through at least a portion of the first portion of the respective coil element to the crossover portion of the coil element, through the respective crossover portion and subsequently through at least a portion of the second portion of the respective coil element, in which any change of flow direction along said path is less than 90° in a lateral direction, the first and second coil elements being arranged to provide electromagnetic coupling between said coil elements along a portion of a length of at least one coil element in both a lateral and a transverse direction.

According to a third aspect of the invention there is provided a method of fabricating an integrated transformer structure, comprising the steps of:

forming a first coil element associated with a transverse axis, the first coil element having at least one turn, the first coil element comprising a first portion provided on a first lateral level, and a second portion provided on a second lateral level, the first and second lateral levels being mutually spaced apart along said transverse axis, the first and second portions being displaced laterally from said axis by different respective distances; and forming at least one crossover portion in the first coil element, whereby the first coil element is configured to provide a conducting path through at least a portion of the first portion of the first coil element to the crossover portion, through the crossover portion and subsequently through at least a portion of the second portion of the first coil element, in which any change of flow direction along said path is less than 90° in a lateral direction.

The method may, in some embodiments, comprise the steps of forming a second coil element associated with said transverse axis, the second coil element having at least one turn comprising a first portion formed on the first lateral level, and a second portion formed on the second lateral level, the first and second portions being laterally offset from one another around said transverse axis.

In some embodiments, the first and second coil elements are formed to provide electromagnetic coupling between the coil elements along a portion of a length of at least one coil element in both a lateral and a transverse direction.

In some embodiments, the first coil element comprises a plurality of turns.

In some embodiments, the second coil element comprises a plurality of turns.

In some embodiments, each turn of said first and second coils is formed to have:

a first portion provided on a first lateral level, and a second portion provided on a second lateral level, the first and second lateral levels being mutually spaced apart along said transverse axis, the first and second portions being displaced laterally from said axis by different distances, and at least one crossover portion, each turn being configured to provide a conducting path through at least a portion of the first portion to the crossover portion, through the crossover portion and subsequently through at least a portion of the second portion, in which any change of flow direction along said path is less than 90° in a lateral direction.

In some embodiments, said first and second portions of each turn each comprises substantially half a turn of said coil element.

In alternative embodiments, each turn of said first and second coils further comprises third and fourth portions.

In some embodiments, each of the first and fourth portions of each turn are laterally offset from the common transverse axis a different distance than the second and third portions of each coil.

In some embodiments, said first and third portions of each coil are provided on a different lateral level to the second and fourth portions of each coil.

In some embodiments, the first and third portions of each coil are in diametrically opposed spaced relationship about the common axis.

In some embodiments, said first, second, third and fourth portions of each turn each comprises generally one quarter of a turn.

In some embodiments, each coil element comprises two turns. In alternative embodiments, each coil element comprises four turns.

In some embodiments, the turns are substantially symmetrical.

In some embodiments, the first coil element is arranged such that no portions of the first coil element overlie one another along a direction parallel to said transverse axis.

In some embodiments, the first coil element comprises a plurality of turns arranged such that adjacent concentric portions of said turns on a given lateral level are separated by a portion of a turn of the second coil element.

In one embodiment, the method comprises the steps of forming a layer of a conductive material on a first lateral level;

patterning said layer of conductive material to form portions of turns of each of the first and second coil elements;

forming a layer of an insulating material above the conductive material on the first lateral level;

forming a layer of a conductive material on the second lateral level; and patterning said layer of conductive material to form corresponding portions of turns of each of the first and second coil elements.

In embodiments of the invention, enhanced coupling is provided between first and second coils of the transformer structure. This is at least in part due to the use of crossover elements that increase a level of coupling between respective first and second coils of a transformer structure.

In embodiments of the invention, an amount of current crowding in a region of the transformer structure where the crossover elements are located is reduced. This is at least in part due to the fact that crossover elements according to embodiments of the invention provide an electrical flowpath with lateral changes of direction less than 90°.

In embodiments of the invention, the electrical characteristics of the primary and secondary coils are substantially the same. This is at least in part due to increased symmetry of primary and secondary coils constructed according to embodiments of the invention. The increased symmetry has the consequence that, per unit length of coil, the average distance from a ground plane is substantially the same for each coil.

In embodiments of the invention, noise self-cancellation is achieved due to the differential layout connection. This connection substantially eliminates common-mode noise.

Whilst reference is made to primary and secondary coils having portions on first and second lateral levels, it will be appreciated that said lateral levels are not necessarily perfectly planar. A small amount of non-planarity may be present. In other words, the lateral levels, although substantially planar, need not be perfectly planar. Furthermore, it will be appreciated that portions of one or each coils within a given lateral level may not be perfectly coplanar, due to variations in fabrication processes and fabrication methodology. Thus, a direction of lateral coupling between adjacent concentric portions of the first and second coils may not be perfectly orthogonal to the transverse axis of the coils. Similarly, a direction of lateral coupling between adjacent portions on respective lateral levels may not be perfectly parallel to the transverse axis of the coils.

It will also be appreciated that reference to coupling between coils along a lateral and a transverse direction is not intended to refer solely to resolved components of a single direction of coupling between two coils. This latter situation is illustrated schematically in FIG. 3a. The direction of coupling between the portions of the primary coil (P) and secondary coil (S) is indicated by arrow C. The resolved components of C in a lateral and transverse direction are indicated as $C_L$ and $C_T$, respectively.

Rather, such reference is intended to refer to coupling between a portion of the primary coil and a portion of the secondary coil which portions are mutually spaced apart within a given lateral level, and at the same time coupling between said portion of the primary coil and another portion of the secondary coil which portions are mutually spaced apart along a direction parallel to said transverse axis of the structure. This situation is illustrated in FIG. 3b with respect to a portion of the primary coil (P) coupled to portions of the secondary coil on two different respective lateral levels. Lateral coupling between portions of the primary and secondary coils in the same lateral level is provided (indicated by arrow C1), and transverse coupling between the same portion of the primary coil and a portion of the secondary coil on a different lateral level is also provided (indicated by arrow C2).

An integrated transformed structure according to embodiments of the present invention has the advantage that coupling along a direction C1 between portions of the same coil (e.g. portions of the primary coil) is avoided. Rather, coupling along direction C1 occurs between the primary coil and the secondary coil, or between the secondary coil and the primary coil.

Furthermore, coupling along direction C2 between portions of the same coil (e.g. portions of the primary coil) is also avoided. Rather, coupling along direction C1 occurs between the primary coil and the secondary coil, or between the secondary coil and the primary coil.

This results in an increase in performance of an integrated transformer structure according to the first embodiment of the invention.

Whilst reference has been made to coupling between a portion of the primary coil on a lateral level and respective different portions of the secondary coil provided on each of two lateral levels, it will be appreciated that the discussion is equally applicable to coupling between a portion of the secondary coil on a given lateral level, and respective different portions of the primary coil provided on each of the respective different lateral levels.

Integrated transformer structures according to embodiments of the invention may be described as having 'interdigitized' coils. The term interdigitized coils refers to coils, such as the primary and secondary coils, having respective portions coupled along a lateral direction (e.g. direction C1, shown in FIG. 3b) and along a transverse direction normal to the lateral direction (e.g. direction C2, also shown in FIG. 3b).

BRIEF DESCRIPTION OF THE DRAWINGS

Embodiments of the present invention will now be described hereinafter, by way of example only, with reference to the accompanying drawings, in which:

FIG. 11 shows (a) a perspective view of region A' and a cross-sectional view along line X1'-X1' of FIG. 10, and (b) a perspective view of region B' and a cross-sectional view along line X2'-X2' of FIG. 10.

DETAILED DESCRIPTION OF THE INVENTION

The following embodiments are intended to illustrate the invention more fully without limiting their scope, since numerous modifications and variations will be apparent to those skilled in the art.

Figure 1:
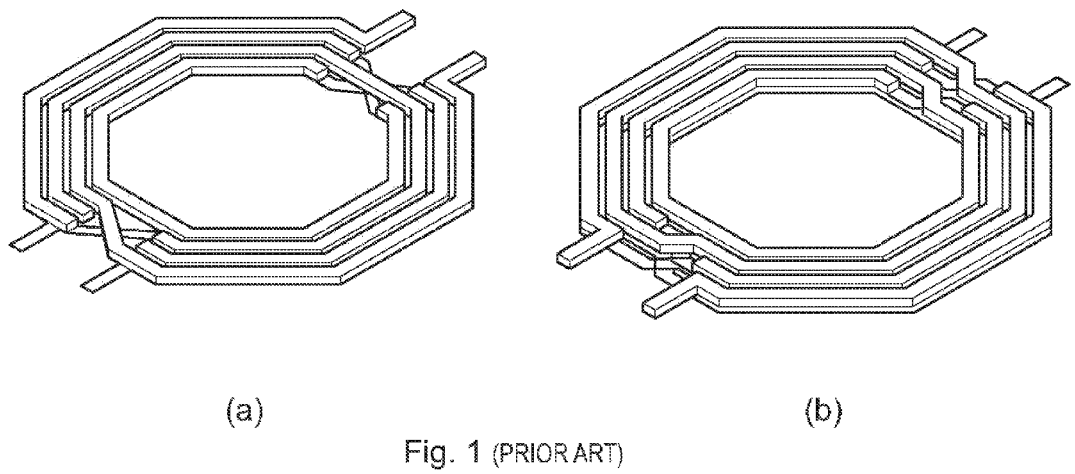
FIG. 1 is a schematic illustration of prior art structures showing (a) a planar transformer having primary and secondary coils having two turns per coil and (b) a transformer having four turns per coil, the primary and secondary coils each being provided on one of two lateral levels spaced apart in a transverse direction.
Figure 2:
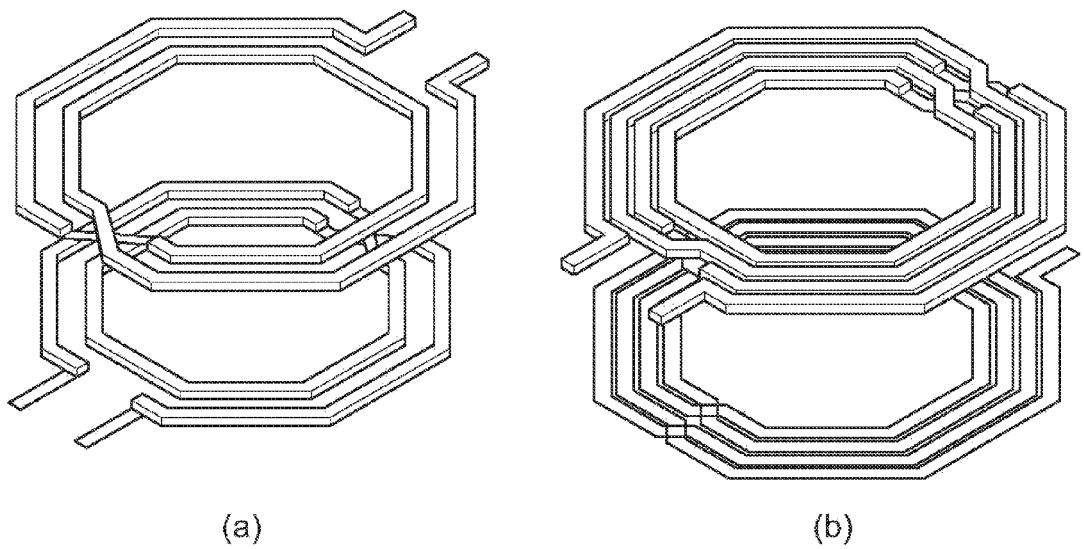
FIG. 2 is a schematic illustration of exploded views of the prior art transformer structures of FIG. 1.
Figure 3A:
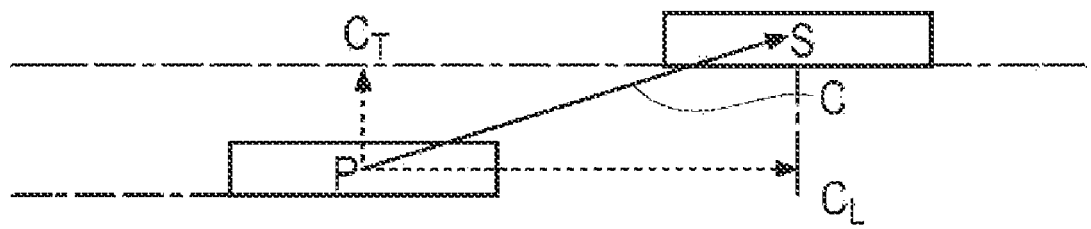
FIG. 3 is a schematic illustration of (a) coupling between two respective portions of coils of a transformer structure showing resolved components of coupling along a lateral and a transverse direction, and (b) coupling between three respective portions of coils along a lateral direction and along a transverse direction.
Figure 3B:
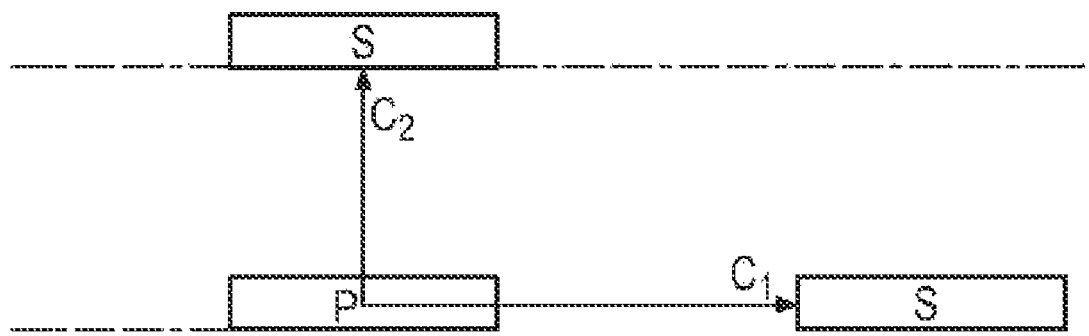
Figure 4:
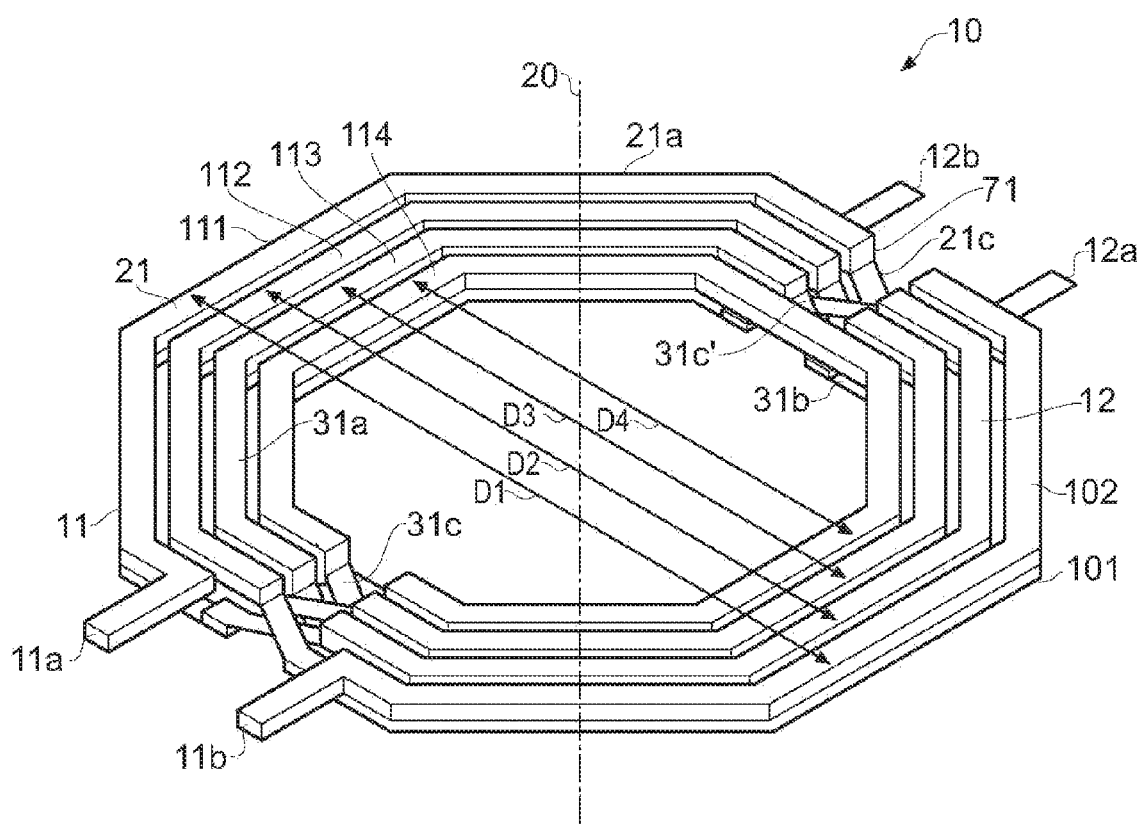
FIG. 4 is a schematic illustration of a transformer structure according to a first embodiment of the invention.

FIG. 4 shows an integrated transformer structure 10 according to a first embodiment of the invention. The structure 10 has a primary coil 11 and a secondary coil 12. In one embodiment, each of the coils is provided with four turns through substantially 360°. Two turns of each coil are provided on each of two different lateral levels.

The primary coil 11 has a pair of terminals 11a, 11b at opposed ends of the coil. The secondary coil has a corresponding pair of terminals 12a, 12b at opposed ends. The terminals of the coils allow electrical connection of the structure to a circuit.

It will be appreciated by persons skilled in the art that embodiments of the invention are not limited to a primary coil and a secondary coil each having four turns. One or each of the coils can have a greater or smaller number of turns. Furthermore, the coils do not necessarily have to have the same number of turns.

In addition, the shape of each coil need not be the same, although advantageously the coils are of similar shape or identical shape in order to provide improved coupling between the coils.

The terminals 11a, 11b, 12a, 12b need not be at opposed ends of a respective coil. One or each terminal of one or each coil may be located away from an end of a respective coil.

The coils may be formed of conducting elements of any suitable cross-sectional shape, including rectangular, square, round, oval or any other suitable shape. Coils according to first and second embodiments of the invention are formed from a conducting track having a generally rectangular cross-section. A width of the track in a lateral plane according to the first and second embodiments of the invention is about 10 μm. Other widths are also useful.

Furthermore, the number of turns need not be a whole number. Coils according to some embodiments may have a fractional number of turns, for example 2.5 turns, or any other suitable number of turns.

Reference to a primary coil and a secondary coil having an integer multiples of turns each of substantially 360° includes primary and secondary coils according to the first and second embodiments of the invention. It will of course be appreciated that, strictly, such coils do not have an integer multiple of coils of exactly 360°, since a gap between opposed ends of the coils is required in order to provide terminals to each of the coils. However, the presence of this gap has been ignored for the purposes of defining the number of turns.

The primary and secondary coils are arranged to have portions on first and second lateral levels 101, 102 that are spaced apart in a transverse direction. In other words, the first and second coils are distributed over two mutually spaced apart planar levels. The planar levels are spaced apart along a transverse axis 20 normal to the two planar levels such that the coils 11, 12 share a common transverse axis 20. The first and second lateral levels are substantially parallel or parallel to one another.

Furthermore, the primary and secondary coils are arranged to have portions provided in the form of four concentric tracks 111, 112, 113, 114 within each lateral level 101, 102. The tracks, in one embodiment, are mutually spaced apart in a given lateral plane. For example, the tracks are mutually spaced by a distance of about 20 μm in a given lateral plane. Other distances are also useful.

Figure 5:
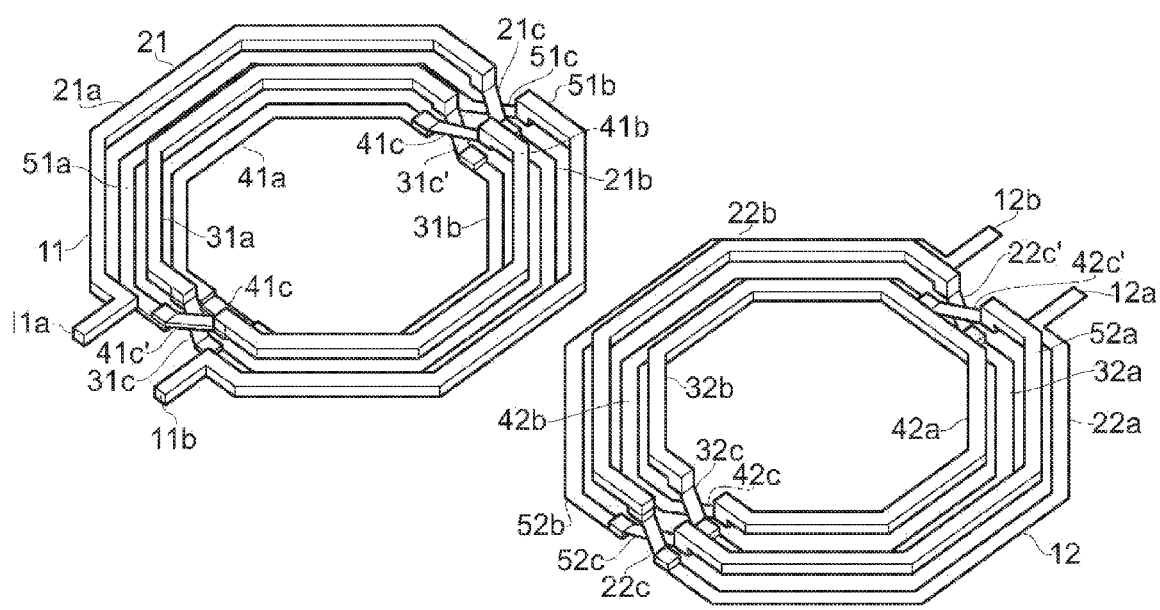
FIG. 5 is a schematic illustration of an exploded view of the structure of FIG. 4.

As illustrated in FIGS. 4 and 5, the primary coil has opposed end portions (or terminals) 11a, 11b on an upper (or second) lateral level 102, whilst the secondary coil has opposed terminals 12a, 12b on a lower (or first) lateral level 101.

Referring to the structure of the primary coil, the first turn 21 of the primary coil 11 (FIG. 5) has a first half turn 21a (of substantially 180°) that begins at terminal 11a on the second lateral level. The half turn 21a has an average diameter D1 (FIG. 4) of a first value. According to the first embodiment, the average diameter D1 has a value of about 182 μm. However it will be appreciated that in other embodiments of the invention the average diameter may be any other suitable value. In some embodiments of the invention, the average diameter D1 has a value of about 282 μm.

Coils are described herein as having an 'average diameter'. It will be appreciated that this is only one way of defining a characteristic of a coil. The parameter 'average diameter' may be used to describe a coil of circular shape as well as a coil of non-circular shape. The term 'average diameter' refers to the distance between diametrically opposed positions of the coil, the positions being midpoints of a given track along a radial direction.

Coils according to embodiments of the present invention include coils of circular shape, as well as coils of generally circular shape (including coils having any number of straight sides, such as coils having three or more straight sides). In the case of coils according to the first and second embodiments, the coils are of generally octagonal shape.

The second half turn 21b of the primary coil is provided on the first lateral level, and has an average diameter D2 (FIG. 4) of a second value which is less than D1. According to the first embodiment, the value of D2 is about 158 μm. Other values for D2 are also useful. The value of D2 is determined on the basis that the average width of the track forming each coil is about 10 μm, and the distance between respective mutually adjacent concentric track portions is 2 μm.

In both the first and second embodiments of the invention, portions of coils of different diameters are arranged to be generally concentric with one another about the common axis 20. The first and second half turns are connected to one another. In one embodiment, the first and second half turns are coupled by a first crossover element 21c.

The crossover element 21c is in the form of a length of conductive material having two bends at respective positions along the length of the material of substantially 45° in opposite directions. Thus, the crossover element allows respective ends of first and second half-turns to be connected such that current flowing through the first half turn flows into the second half-turn without experiencing a change of direction in a lateral plane of 90° or more. That is, any change of direction in the lateral plane is less than 90°. According to the first and second embodiments, any change of flow direction along the length of a crossover element does not exceed 45° in a lateral plane.

It will be appreciated that in alternative embodiments, a change of flow direction as current passes through the crossover element may be greater than 45°, but less than 90°. In further alternative embodiments of the invention, the change of flow direction may be less than 45'.

Each of the primary and secondary coils 11, 12 comprises several crossover elements similar to the crossover element 21c connecting the first and second half-turns of the primary coil 11.

It will also be appreciated that in some embodiments of the invention one or more of the crossover elements may be formed integrally with one or both of the respective portions of the coil element between which the crossover element provides a flowpath. In other words, one or both of the portions of the coil element being connected by the crossover element are formed as a single, continuous member with the crossover element, rather than as discrete elements in mutual contact.

The second half turn 21b of the primary coil 11 is connected to a third half turn 31a that is provided on the second lateral level. Half turns 21b and 31a are connected to one another by a second crossover element 31c.

The third half turn 31a has an average diameter D3 which is less than D2. According to the first embodiment, the value of D3 is about 134 μm.

The third half turn 31a is connected by a third crossover element 31c' to a fourth half-turn 31b, the fourth half-turn 31b being provided on the first lateral level.

A fifth half-turn 41a is also provided on the first lateral level, as in the case of the fourth half-turn 31b. The fourth and fifth half-turns 31b, 41a are connected to one another by an underpass element 41c. Underpass element 41c is employed because both half-turns are provided on the same (i.e. the first) lateral level, and both have an average diameter of D4, which is less than D3. Thus, the fourth and fifth half-turns are connected without the requirement for a change in average diameter of a half-turn, or a change in lateral level of a half-turn. According to the first embodiment of the invention the value of D4 is 110 μm. It will be appreciated that in alternative embodiments, fourth and fifth half-turns 31b, 41a are formed as a single continuous turn and that therefore underpass element 41c is unnecessary in such embodiments.

The fifth half-turn 41a is itself connected to a sixth half-turn 41b by a fourth crossover 41c. The sixth half-turn 41b has an average diameter D3 and is provided on the second lateral level.

Similarly, the seventh half-turn 51a has an average diameter D2 and is provided on the first lateral level. The sixth and seventh half-turns are connected by a fifth crossover element 41c'.

Finally, the eighth half-turn 51b is provided on the second lateral level and terminates in terminal 11b. The seventh and eighth half-turns are connected to one another by a sixth crossover element 51c.

Further details regarding the regions of the structure in which the crossover elements are provided are illustrated in FIG. 7.

Figure 6:
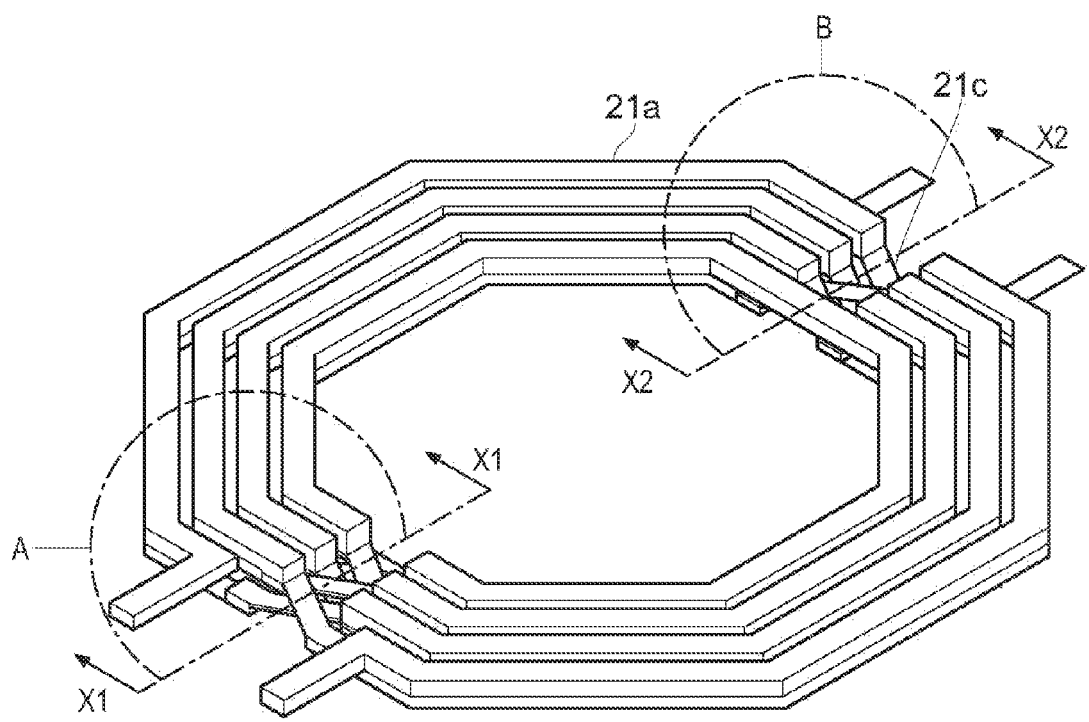
FIG. 6 is a schematic illustration of a transformer structure according to the first embodiment of the invention.
Figures 7A, 7B:
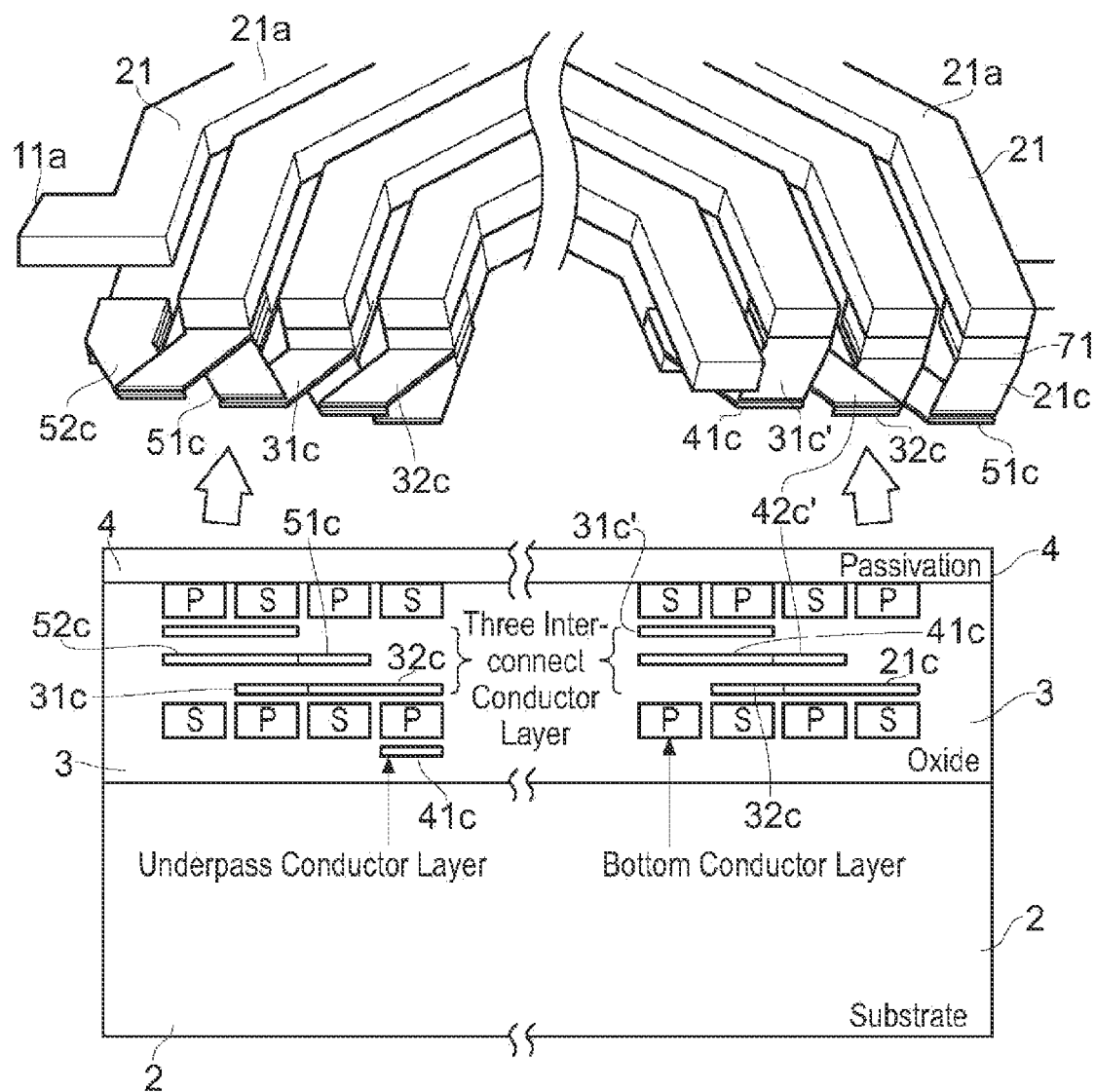
FIG. 7 shows (a) a perspective view of region A and a corresponding cross-sectional view along line X1-X1 of FIG. 6, and (b) a perspective view of region B and a corresponding cross-sectional view along line X2-X2 of FIG. 6.

FIG. 7(a) shows a perspective view of region 'A' of FIG. 6, and a cross-sectional view along line X1-X1 of FIG. 6. FIG. 7(b) shows a perspective view of region 'B' of FIG. 6, and a cross-sectional view along line X2-X2 of FIG. 6. In the figures, letters 'P' and 'S' identify the 'primary' and 'secondary' coils, respectively.

With reference to FIGS. 7(a) and (b), it may be seen that according to the first embodiment, the crossover elements are substantially planar, provided on lateral levels located along the transverse axis 20 between the first and second lateral levels.

The primary and secondary coils 11, 12 are provided in an oxide layer 3 formed over a substrate 2. A passivation layer 4 is provided above the coils 11, 12. It will be appreciated that one or more via elements are associated with each crossover element in order to form a continuous flowpath through each coil.

By way of illustration, in the case of the first turn of the primary coil 21, crossover element 21c (FIG. 7(b)) is connected to the first half-turn 21a by a via element 71. Via element 71 runs vertically downwards to the crossover element 21c from a lower surface of first half-turn 21a at an end of half-turn 21a opposite the end at which terminal 11a is located. In other words, via element 71 provides a vertical connection between the crossover element 21c and the first half-turn 21a of the first turn 21 of the primary coil 11.

The secondary coil 12 is configured in a complementary manner to the primary coil 11 as shown schematically in FIGS. 4, 5 and 7.

The secondary coil 12 has eight half-turns, respectively labelled 22a, 22b, 32a, 32b, 42a, 42b, 52a and 52b. Crossover elements 22c, 22c', 32c, 42c, 42c' and 52c connect respective adjacent ends of the half-turns, in a similar manner to the primary coil 11.

It has been recognised that a problem with the structure of Lee described above is that portions of one coil overlie one another in the vicinity of via elements between levels of the structure. This reduces efficiency of the structure by reducing the length of each coil over which coupling with the other coil is possible.

A structure according to the first embodiment of the invention has the advantage that portions of a given coil of the structure do not overlie one another. This is at least in part due to the crossover elements employed by structures according to embodiments of the present invention. Crossover elements according to embodiments of the present invention do not have 90° bends in a lateral plane in the vicinity of the crossover elements.

It will be appreciated by those skilled in the art that in alternative embodiments of the invention, one or more portions of a given coil may in fact overlie one another.

It has been recognised that a further disadvantage of the structure of Lee is the presence of two closely spaced 90° bends on each level in the region of via elements between levels of the structure. The presence of these bends results in an increase in the series resistance of the coils, leading to current-crowding in the vicinity of the 90° bends. This results in a significant degradation in transformer performance.

Structures according to embodiments of the present invention have the advantage of reduced current crowding in the vicinity of the crossover elements. This is at least in part due to the absence of 90° bends in a lateral plane in the vicinity of the crossover elements.

It will be appreciated by those skilled in the art that in alternative embodiments of the invention, not all of the members connecting portions of coils on different lateral levels have the characteristic that any change of flowpath they provide does not exceed 90° in a lateral direction. One or more crossover members may be provided that do provide a change of flowpath that exceeds 90° in a lateral direction, in either the primary coil, the secondary coil, or both the primary and the secondary coils.

It is noted that, in an integrated transformer structure according to the first embodiment of the invention, electrical characteristics of respective primary and secondary coils may differ slightly due to asymmetry in the distance of respective lengths of each coil from a substrate 2 provided below the structure (FIG. 7). For example, the primary coil 11 (FIGS. 4 and 5) has its largest diameter, outermost portion of the coil (i.e. half-turns 21a and 51b) located a greater distance from the substrate 2 than the outermost portions 22a, 52b of the secondary coil 12.

According to the first embodiment of the invention, the substrate 2 is a silicon substrate. It will be appreciated that the substrate 2 may be made from any suitable substrate material such as SiGe, GaAs, $Al_2O_3$ or any other suitable substrate material.

In variations of the first embodiment of the invention, concentric tracks of the coils may be of a greater diameter or a smaller diameter. For example, in some embodiments of the invention, the values of D1, D2, D3 and D4 are greater than those of the first embodiment by 100 µm. That is, the values are, respectively, 282 µm, 258 µm, 234 µm and 210 µm.

Figure 8:
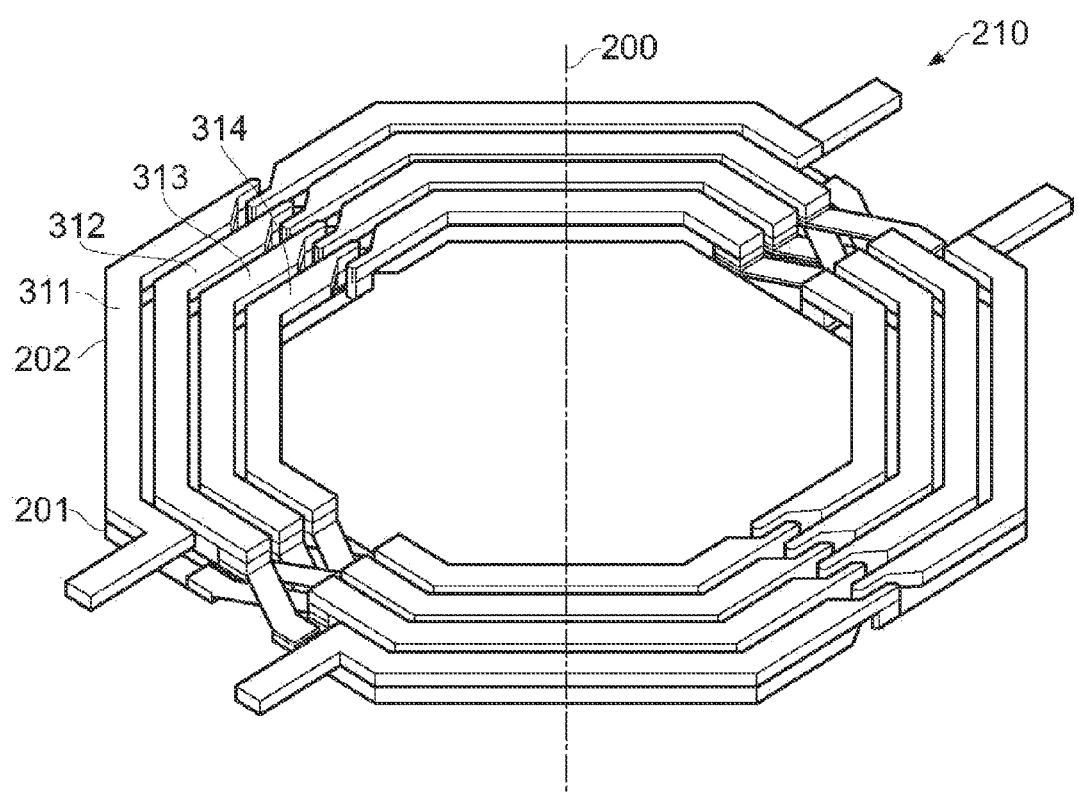
FIG. 8 is a schematic illustration of a transformer structure according to a second embodiment of the invention.

FIG. 8 shows a structure 210 according to a second embodiment of the invention.

Figure 9:
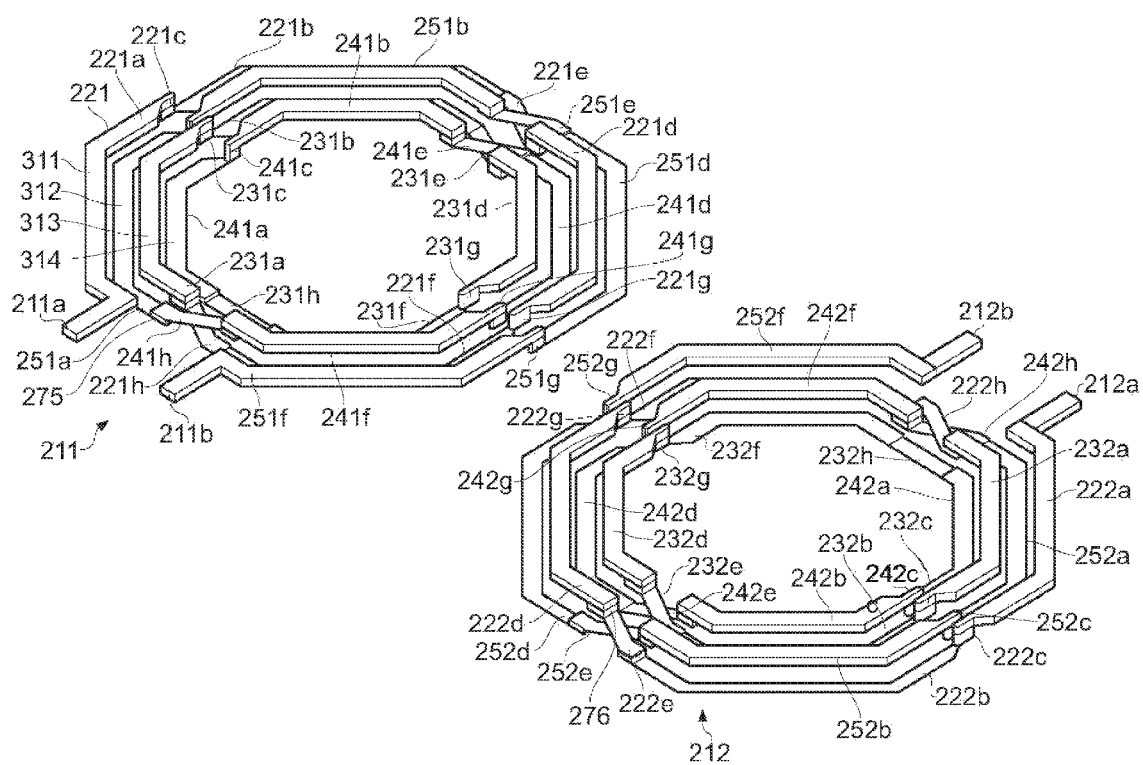
FIG. 9 is a schematic illustration of an exploded view of the structure of FIG. 8.

FIG. 9 is an exploded view of the structure of FIG. 8 and shows two coils (a primary coil 211 and a secondary coil 212) that comprise the structure of FIG. 8. The primary coil has a pair of terminals 211a, 211b. The secondary coil has a corresponding pair of terminals 212a, 212b. The terminals of the coils allow electrical connection of the structure to a circuit. The primary and secondary coils each have four turns through substantially 3600.

As discussed in the context of the first embodiment, it will be appreciated by persons skilled in the art that embodiments of the invention are not limited to a primary coil and a secondary coil each having four turns. One or each of the coils of the second embodiment can have a greater or smaller number of turns. Furthermore, the coils do not necessarily have to have the same number of turns.

Furthermore, the shape of each coil need not be the same, although advantageously the coils are of similar shape or identical shape in order to provide improved coupling between the coils.

A first turn 221 of the primary coil 211 has four quadrants 221a, 221b, 221d and 221f. Quadrants 221a and 221d are provided on a second lateral level 202, whilst quadrants 221b and 221f are provided on a first lateral level 201 located below the second lateral level 202 (as viewed with respect to the orientation of FIG. 9). As in the case of the first embodiment, the first and second lateral levels 201, 202 are mutually parallel and spaced apart along a common transverse axis 200 which is substantially orthogonal to the first and second lateral levels.

Quadrants 221a and 221b have an average diameter D1 (corresponding to a first (outer) track 311 of the structure) and are connected to one another by a via member 221c. Quadrants 221d and 221f have an average diameter D2 which is less than that of D1, corresponding to a second track 312.

According to the second embodiment of the invention, the value of D1 is 182 μm and the value of D2 is 158 μm. The value of D2 is determined on the basis that the width of the track is 10 μm, whilst the spacing between mutually adjacent concentric turns of the structure is 2 μm.

Quadrants 221b and 221d are connected by a crossover element 221e, whilst quadrants 221d and 221f are connected by a via member 221g similar to via member 221c.

The term 'via member' (e.g. members 221c and 221g) will be used to refer to a member providing a flowpath between respective pairs of quadrants having similar average diameters, but being located on different respective levels of the structure.

The term 'via element' will be used to refer to an element associated with a crossover element that provides a flowpath between a crossover element and a quadrant of the structure. Since crossover elements are generally provided at lateral levels intermediate between the first and second lateral levels 201, 202, individual via elements do not necessarily span the entire distance between first and second levels. One or more via elements may be associated with each crossover element.

A second turn of the primary coil 211 also comprises four quadrants, 231a, 231b, 231d and 231f. Quadrants 231a and 231d are provided on a second lateral level 202, whilst quadrants 231b and 231f are provided on a first lateral level 201 located below the second lateral level 202. The first and second quadrants 231a, 231b of the second turn have an average diameter D3 which is less than D2, corresponding to a third concentric track 313. The value of D3 according to the second embodiment of the invention is 134 μm.

The first quadrant 231a of the second turn is connected to the fourth quadrant 221f of the first turn by a crossover element 221h. The second quadrant 231b of the second turn is connected to the first quadrant 231a of the second turn by a via member 231c. In turn, a third quadrant 231d of the second turn is provided on the second lateral level 202 and is connected to the second quadrant 231b by a crossover element 231e. Finally, a fourth quadrant 231f of the second turn is connected to the third quadrant 231d by a via member 231g.

The third and fourth quadrants 231d, 231f of the second turn have an average diameter D4 which is less than D3 and corresponds to a fourth concentric track 314 of the structure. The value of D4 according to the second embodiment is 110 μm.

A third turn of the primary coil 211 comprises four quadrants 241a, 241b, 241d and 241f. Quadrants 241a and 241d are provided on the first lateral level, whilst quadrants 241b and 241f are provided on the second lateral level. Quadrants 241a and 241b are of an average diameter D4 corresponding to track 314, whilst quadrants 241d and 241f are of an average diameter D3 corresponding to track 313. Quadrant 241b is connected to quadrant 241a by a via member 241c. Quadrants 241b and 241d are connected by a crossover element 241e, whilst quadrants 241d and 241f are connected by a via member 241g.

A first quadrant 241a of the third turn is directly connected to the fourth quadrant 231f of the second turn by an underpass element 231h. As in the case of underpass element 41c of the first embodiment, underpass element 231h of the second embodiment is not required to cross between inner concentric track 314 and concentric track 313 adjacent to inner concentric track 314. Furthermore, quadrants 241a and 231f are both provided on the first lateral level.

It will be appreciated that in some embodiments, quadrants 231f and 241a may be formed from a single member without the need for an underpass element 231h.

End portions of quadrants on respective tracks that are required to be connected to one another are connected by crossover elements (including via elements), whilst end portions of quadrants on the same track but different lateral levels are connected to one another by via members.

Similarly, the fourth turn of the primary coil 211 comprises four quadrants 251a, 251b, 251d and 251f. Quadrants 251a and 251d are provided on the first lateral level 201, whilst quadrants 251b and 251 fare provided on the second lateral level 202. As in the case of the third turn, mutually adjacent quadrants of the fourth turn are provided on respective first or second lateral levels. Quadrants 251a and 251b have an average radius D2, whilst quadrants 251d and 251f have an average radius D. Quadrants 251b and 251d are connected by a crossover element 251e, whilst quadrants 251d and 251f are connected by a via member 251g.

A flowpath between the first and second turns is provided by crossover element 221h; similarly, a flowpath between the third and fourth turns is provided by crossover element 241h.

The secondary coil is constructed in a complementary manner to the primary coil. Thus, the secondary coil has terminals 212a and 212b at opposed ends. Because of the increased symmetry of the transformer structure 210, terminals 212a and 212b are provided on the second lateral level 202. Thus, the terminals of the secondary coil are provided on the same lateral level as the terminals 211a, 211b of the primary coil.

The secondary coil has sixteen quarter-turn coil quadrants, labelled respectively (in order beginning at terminal 212a) 222a, 222b, 222d, 222f, 232a, 232b, 232d, 232f, 242a, 242b, 242d, 242f, 252a, 252b, 252d and 252f. Crossover elements 222e, 222h, 232e, 242e, 242h, and 252e connect, respectively, quadrants 222b and 222d, 222f and 232a, 232b and 232d, 242b and 242d, 242f and 252a, and 252b and 252d. The crossover elements provide flowpaths between pairs of quadrants which are on respective levels, and respective concentric tracks of the transformer structure. Additionally, the secondary coil has 8 via members, labelled respectively, 222c 232c, 242c, 252c, 222g, 232g, 242g and 252g.

Underpass element 232h connects quadrants 232f, 242a of inner track 314.

Figure 10:
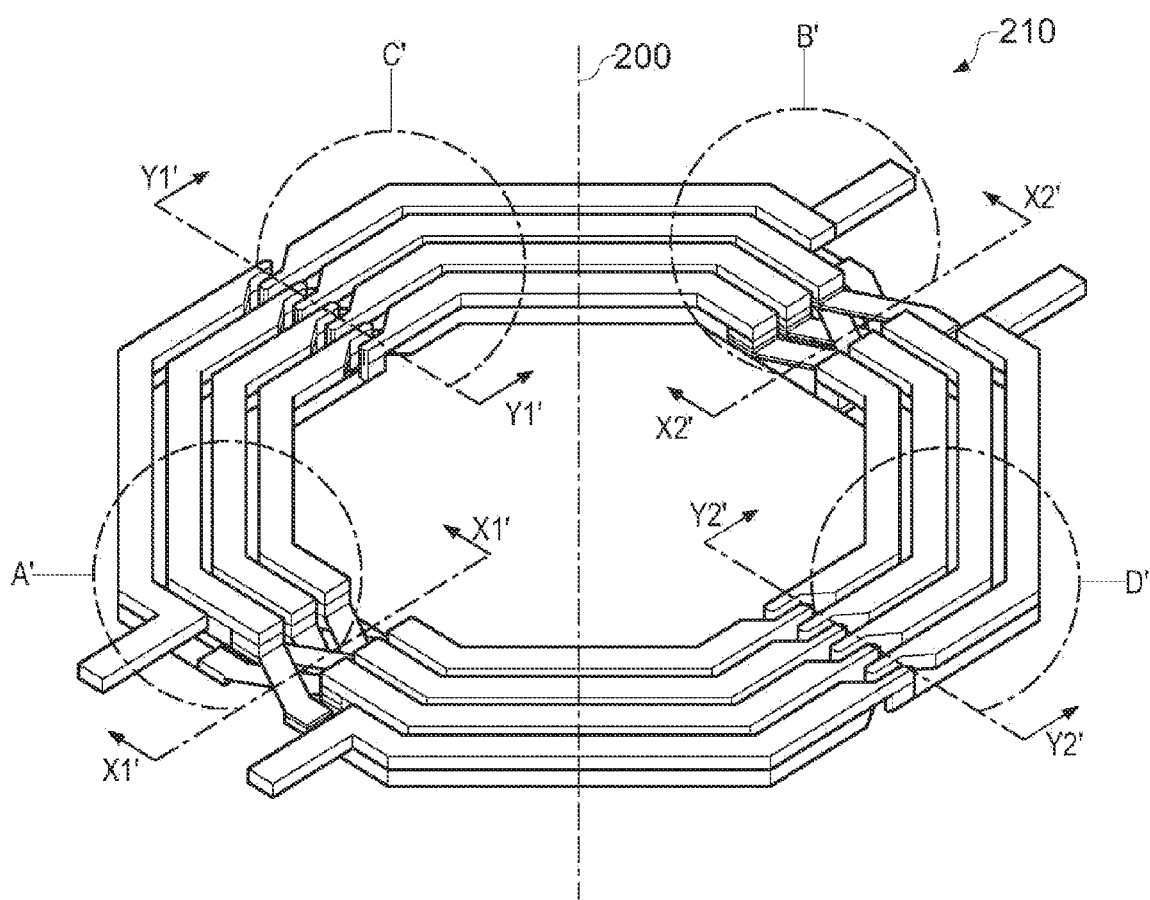
FIG. 10 is a schematic illustration of a transformer structure according to the second embodiment of the invention.

FIG. 11(a) shows a perspective view of region A' of FIG. 10, and a cross-sectional view along line X1'-X1' of FIG. 10. FIG. 11(b) shows a perspective view of region B' of FIG. 10, and a cross-sectional view along line X2'-X2' of FIG. 10.

The primary and secondary coils 211, 212 are provided in an oxide layer 3' formed above a substrate 2'. A passivation layer 4' is provided above the coils 211, 212.

In the figures, the letters 'P' and 'S' represent the 'primary' and 'secondary' coils, respectively.

With reference to FIGS. 11(a) and (b), it may be seen that according to the second embodiment, the crossover elements are also substantially planar, as in the case of the first embodiment, provided on lateral levels located along the transverse axis 200 between the first and second lateral levels.

As in the case of the first coil element, it will be appreciated that one or more via elements are also associated with each crossover element of the second embodiment in order to form a continuous flowpath through each coil.

By way of illustration, in the case of the crossover element 242h (FIG. 11(b)) which provides a flowpath between the twelfth and thirteenth quadrants 242f, 252a of the secondary coil 212, a via element 72 connects crossover element 242h to quadrant 242f. Crossover element 242h is located at a lateral level between the levels 201 and 202 at which quadrants of the coil are provided.

Via element 72 runs vertically downwards from a lower surface of quadrant 242f, to crossover element 242h. In other words, via element 72 provides a vertical connection between the crossover element 242h and quadrant 242f.

Figures 12A, 12B:
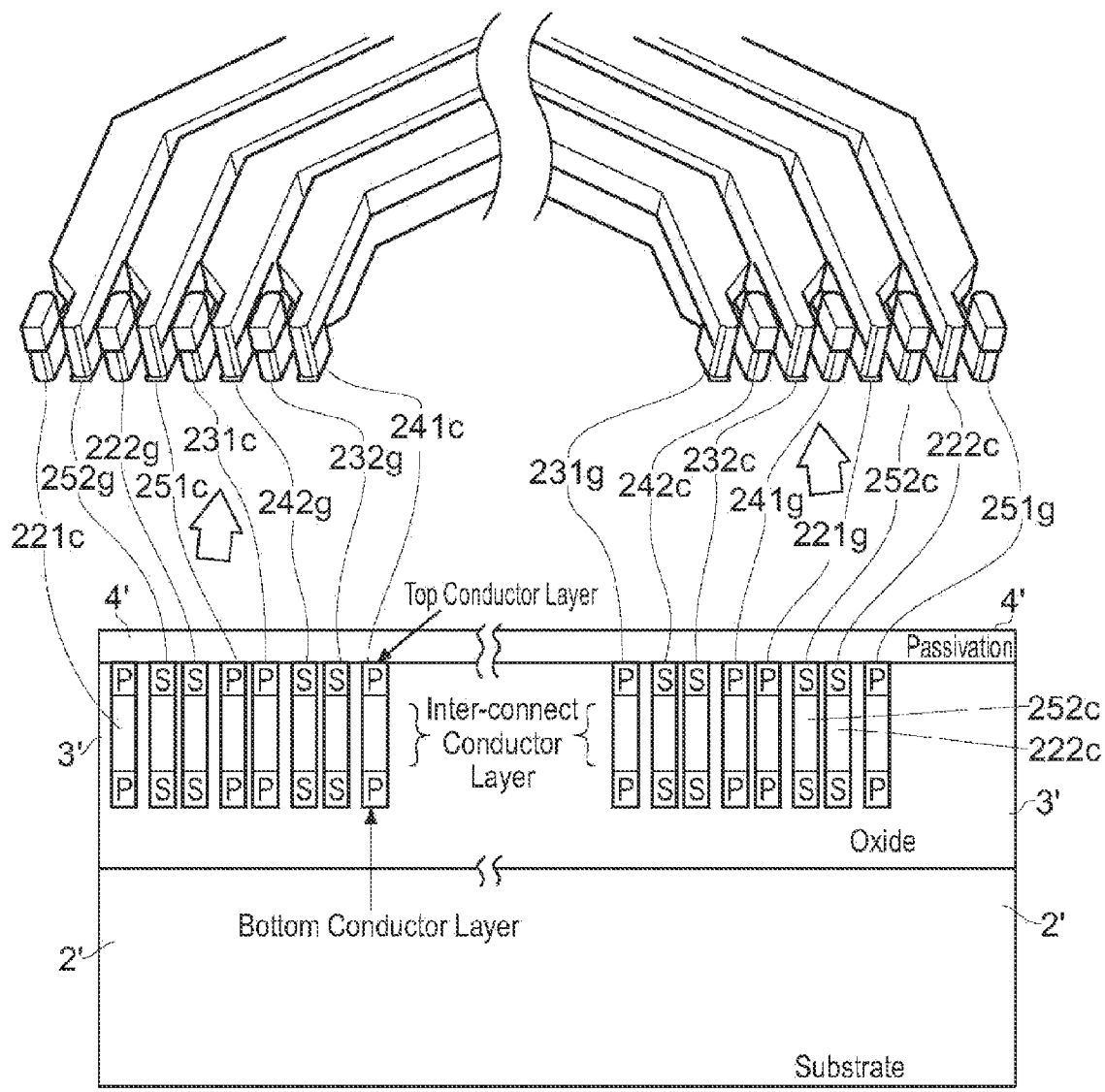
FIG. 12 shows (a) a perspective view of region C' and a cross-sectional view along line Y1'-Y1' of FIG. 10, and (b) a perspective view of region D' and a cross-sectional view along line Y2'-Y2' of FIG. 10.

FIG. 12(a) shows a perspective view of region C' of FIG. 10, and a cross-sectional view along line Y1'-Y1' of FIG. 10. FIG. 12(b) shows a perspective view of region D' of FIG. 10, and a cross-sectional view along line Y2'-Y2' of FIG. 10. In these regions, via members are provided, as discussed above.

The second embodiment of the invention has the advantage over the first embodiment that the electrical characteristics of the primary and secondary coils are more closely matched. This is at least in part due to the increased symmetry of the primary and secondary coils. The increased symmetry has the consequence that each of the primary and secondary coils has an equal number of quadrants of each average diameter (D1, D2, D3 and D4, respectively) located on each of the first and second lateral levels.

In contrast, a transformer structure according to the first embodiment of the invention (FIG. 5), has no such symmetry. Thus, for example, the primary coil has half-turns 21a and 51b of average diameter D1 located on the second lateral level, whilst the secondary coil has half-turns 22a and 52b of average diameter D1 located on the first lateral level. Taking account of the entire lengths of the primary and secondary coils, the consequence is that, per unit length of coil, the primary coil of the first embodiment is on average located further from a ground plane of the substrate than the secondary coil. This has significant implications for the relative performance of transformers constructed according to the first and second embodiments of the invention, respectively.

In variations of the second embodiment of the invention, concentric tracks of the two coils are of a greater diameter or a smaller diameter. For example, in some embodiments of the invention, the values of D1, D2, D3 and D4 are, respectively, 252 μm, 238 μm, 224 μm and 210 μm. It will be appreciated by persons skilled in the art that embodiments of the invention are not limited to these specific values. Any suitable values of D1, D2, D3 and D4 may be used.

Figure 13:
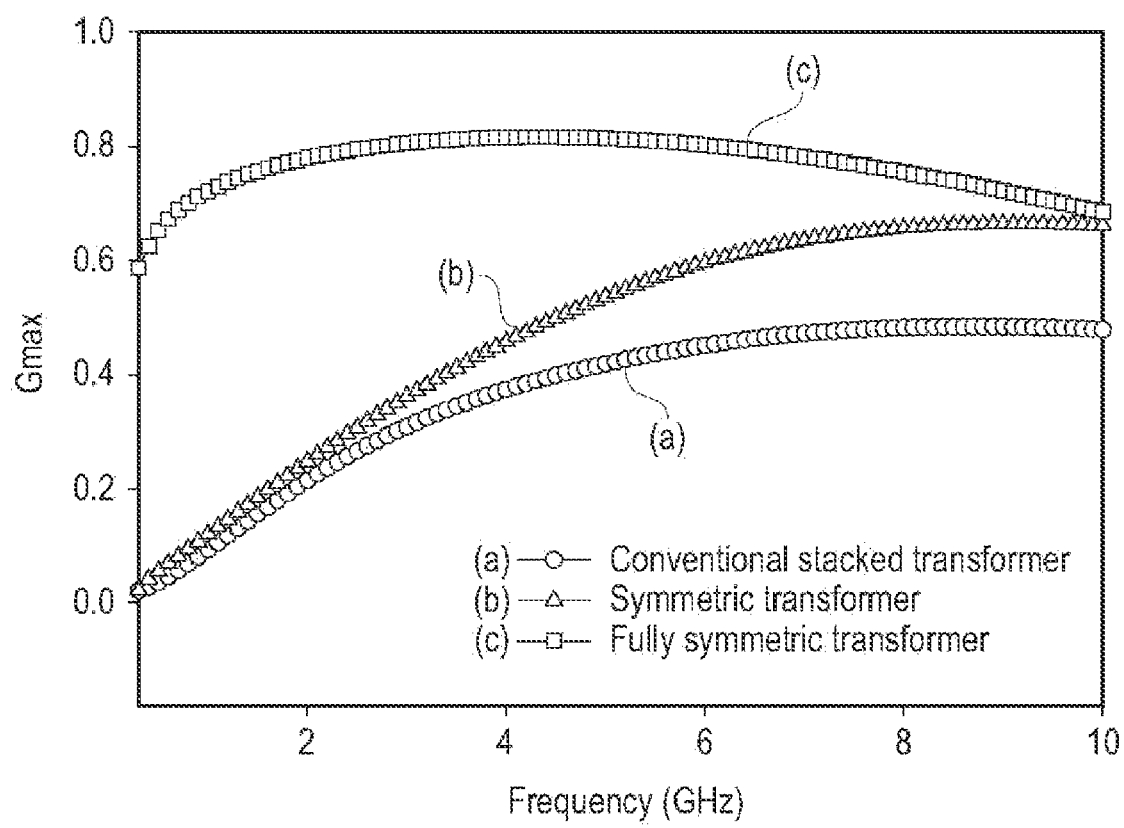
FIG. 13 is a graph showing the amount of power transfer (Gmax) between primary and secondary coils as a function of frequency for (a) a conventional stacked transformer; (b) a transformer according to the first embodiment of the invention and (c) a transformer according to the second embodiment of the invention.

FIG. 13 shows the amount of power transfer (Gmax) between primary and secondary coils as a function of frequency for (a) a conventional stacked transformer; (b) a transformer according to the first embodiment of the invention, and (c) a transformer according to the second embodiment of the invention. It can be seen from this graph that a transformer according to the first embodiment shows an improvement in coupling between coils over the conventional stacked transformer. The amount of improvement can be seen to increase as the frequency of the alternating current signal increases.

In the case of the second embodiment, an even more substantial improvement in coupling is provided over the conventional stacked transformer. Furthermore, the variation in coupling as a function of frequency is substantially less than that measured in the case of the conventional stacked transformer or a transformer according to the first embodiment of the invention.

Some embodiments of the invention have the advantage of providing noise self-cancellation when the structure is connected to an external circuit in a differential layout connection. This connection substantially eliminates common-mode noise. In a differential layout connection, the input of the structure is connected in differential mode. Thus, instead of applying a normal input potential Vin to one terminal of the structure, and zero potential to the other terminal of the structure, a voltage Vin/2 is applied to one terminal, and a potential −Vin/2 is applied to the other terminal. In some RFIC applications, the primary and secondary coils must be of substantially identical inductance in order for the circuit to operate correctly according to the differential mode input described. The first and second embodiments of the invention described herein provide substantially identical inductance values and are therefore ideally suited to connection in a differential layout configuration.

For example, embodiments of the invention provide an integrated transformer structure which introduces noise self-cancellation by interdigitizing the primary and secondary coils whilst at the same time equalizing the physical length of the primary and secondary coils.

The use of several metal layers as crossover elements to interdigitize the coils results in the impedances of the two coils being substantially identical. This feature is particularly important in a high performance transformer design to provide efficient power transfer from the primary coil to the secondary coil.

Some embodiments of the invention provide improved performance over prior art transformers, whilst requiring less space.

A structure according to the second embodiment of the invention has the advantage that portions of a given coil of the structure do not overlie one another. In other words, no portions of the same coil are in mutually confronting relationship with one another along a direction parallel to the transverse axis. This is at least in part due to the nature of the crossover elements employed by structures according to embodiments of the present invention. Crossover elements according to embodiments of the present invention do not have 90° bends in a lateral plane in the vicinity of the crossover elements.

Some embodiments of the invention have the advantage of reduced current crowding. This is due to the elimination of 90° bends in a lateral plane in the vicinity of crossover elements. In some embodiments of the invention this feature also enables avoidance of the situation where portions of the same coil element directly overlie one another in a transverse direction. That is to say, the situation is avoided where portions of the same coil are in directly confronting relationship in a transverse direction. Such a situation results in a reduced coupling between respective primary and secondary coils, and therefore a reduction in power transfer Gmax between respective coils.

Figure 14:
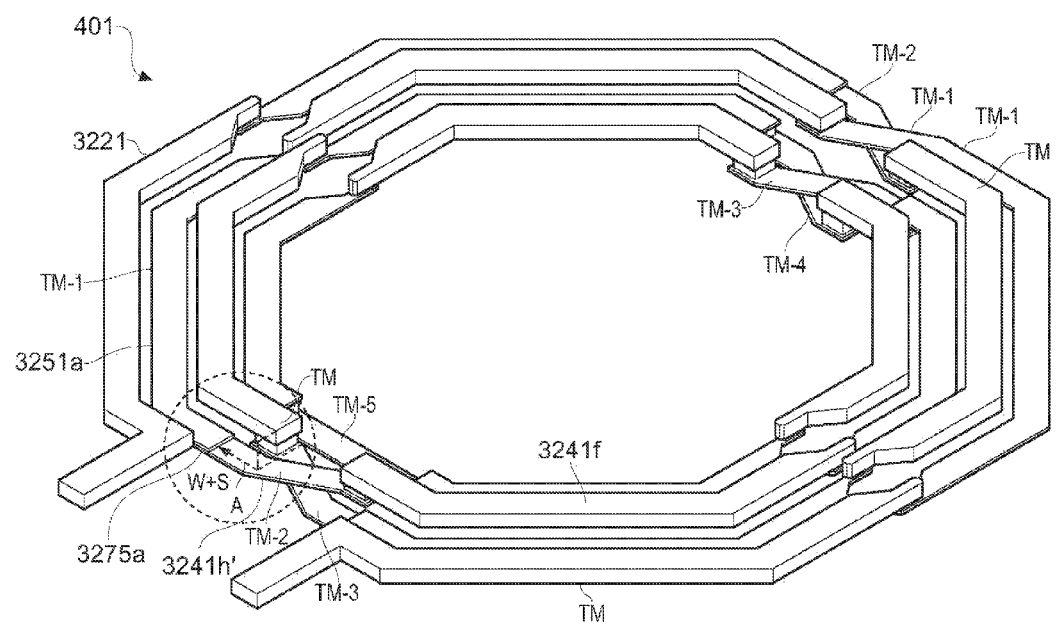
FIG. 14 is a schematic illustration of a primary coil of a transformer structure according to a third embodiment of the invention.
Figure 15:
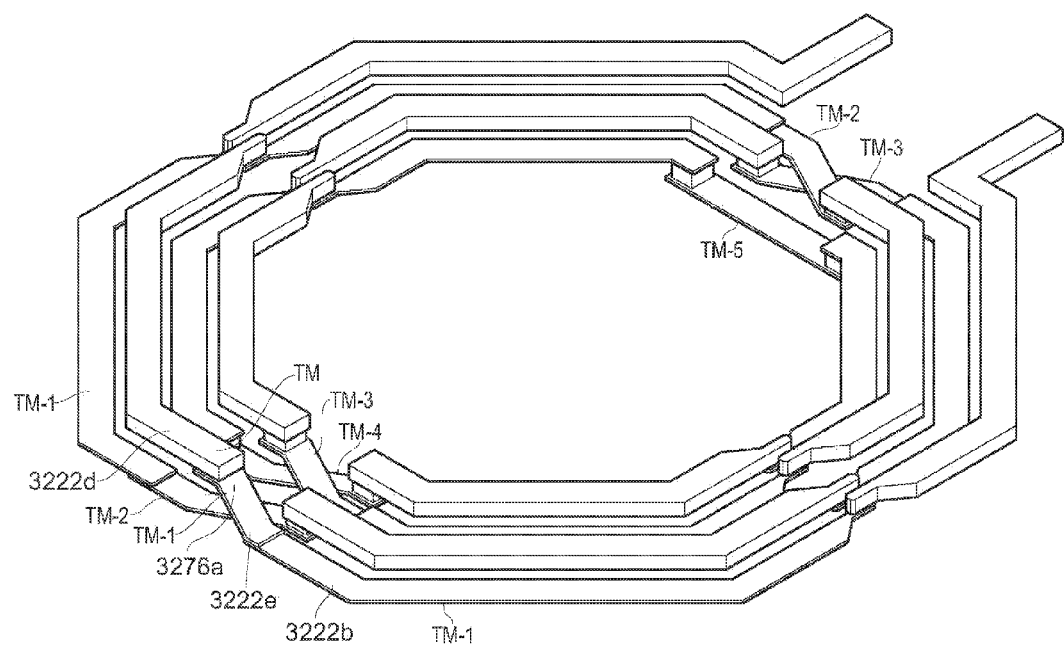
FIG. 15 is a schematic illustration of a secondary coil of a transformer structure according to the third embodiment of the invention.
Figure 16:
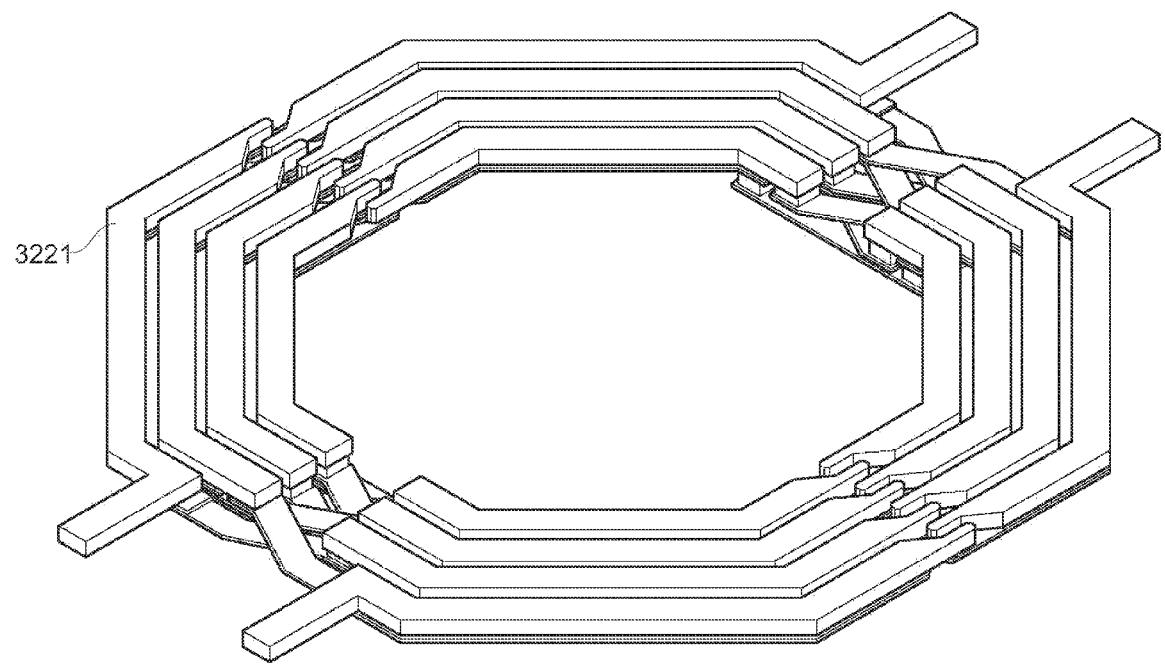
FIG. 16 is a schematic illustration of a transformer structure according to the third embodiment of the invention.

FIG. 14 shows the primary coil member of an integrated transformer structure according to a third embodiment of the invention. FIG. 15 shows the secondary coil member of an integrated transformer structure according to the third embodiment.

The third embodiment is constructed in a similar manner to the second embodiment. However, the principal difference between the first and second embodiments lies in the relative positions of contact points between quarter turns (quadrants) of the coil elements, and the crossover elements connected to those quarter turns (quadrants).

Thus, in the case of the second embodiment (FIG. 9), quarter turn 222d of the secondary coil 212 is connected to crossover element 222e by via element 276. Via element 276 directly overlies the corresponding contact via element 275 of the primary coil, which connects crossover element 241h to quarter-turn 251a of the secondary coil.

According to the third embodiment, corresponding via elements of the primary and secondary coils, such as via elements 275, 276, that directly overlie one another in structures according to the second embodiment, are offset from one another along a direction normal to the transverse axis. This feature has the advantage that the number of interconnect conductor layers needed to form a connection between portions of a given coil on respective different lateral levels is reduced. This feature in turn enables coupling between the first and second coils to be improved.

According to the third embodiment of the invention, it is the via elements that connect crossover elements to portions of a coil on the lower lateral level that are offset with respect to their positions in structures according to the second embodiment. It will be appreciated that in alternative embodiments it may be the via elements that connect crossover elements to portions of a coil on the upper lateral level that are offset.

Figure 17:
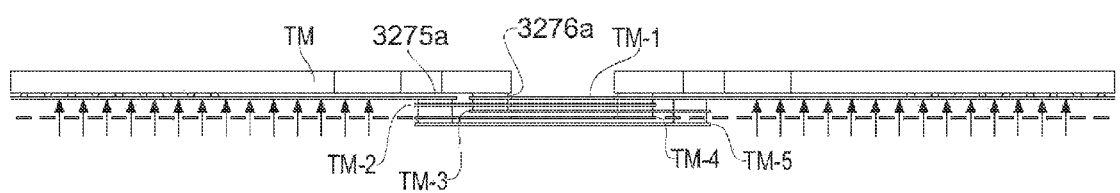
FIG. 17 is a cross-sectional schematic illustration of the structure according to the third embodiment of the invention.

FIG. 17 is a cross-sectional schematic diagram showing the metallisation layers used to construct an integrated transformer structure according to the third embodiment of the invention.

In a structure according to the third embodiment, portions of a coil on the second lateral level are formed by metallisation layer TM, whilst portions of a coil on the first lateral level are formed by metallisation layer TM-1. In structures according to the first and second embodiments, portions of a coil on the second lateral level are formed by metallisation layer TM, whilst portions of a coil on the first lateral level are formed by metallisation layer TM-4. Thus, structures according to the third embodiment have the advantage that the distance between the first and second lateral levels is lower, thereby increasing the amount of electromagnetic coupling between the primary and secondary coils.

The feature of a lateral offset between contact points according to the third embodiment is illustrated in FIGS. 14 to 17. FIG. 14 shows the primary coil 401 of a structure according to the third embodiment. Features in common between the second and third embodiments are referenced in FIGS. 14, 15 and 16 using the same reference numerals as in FIGS. 8 to 12, prefixed with the numeral 3.

It can be seen that the via element 3275a providing electrical contact between half turn 3251a and crossover element 3241h' of the primary coil is located at a position that is displaced in a lateral direction along the direction of arrow 'A' compared with the location of via 275 (FIG. 9) in structures according to the second embodiment of the invention. Via 3275a is displaced by a distance (W+S), where 'W' corresponds to a width of the conducting track of which the crossover element 3241h' is made, and 'S' corresponds to an offset value. According to the third embodiment, the offset value 'S' is approximately the same as that of the width 'W'. In alternative embodiments of the invention the offset value may be greater than or less than the width 'W'. In some embodiments the offset value 'S' is zero.

Considering now a secondary coil according to the third embodiment (FIG. 15), the via element 3276a between quarter turn 3222d of the secondary coil and crossover element 3222e of the secondary coil is in substantially the same position as the corresponding via element 276 of the secondary coil of the second embodiment of the invention.

In structures according to the third embodiment, the corresponding contact points 3275a and 3276a of the primary and secondary coils, respectively, are offset from one another along a lateral direction. This enables the conducting tracks on the first lateral level to be provided on metallisation level TM-1 instead of metallisation level TM-4. Thus, the number of separate interconnect conductor layers needed to form a connection between portions of a given coil on respective different lateral levels is reduced. This feature in turn enables coupling between the first and second coils to be improved, since the distance between the first and second lateral levels may be reduced.

The metallisation level of the structure, TM-1, TM-2, TM-3, TM-4, TM-5 respectively, at which each of the crossover elements are provided is indicated in FIGS. 14 and 15.

Figure 18:
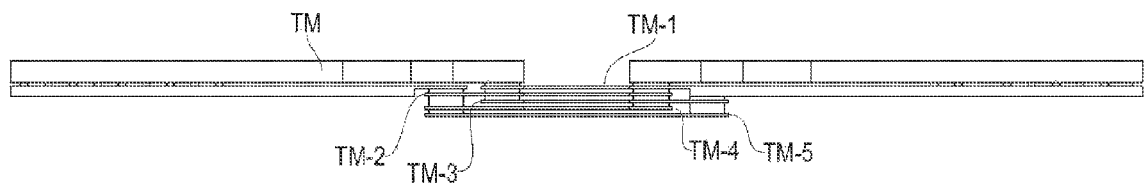
FIG. 18 is a cross-sectional schematic illustration of a further structure according to a variation of the third embodiment of the invention.

In variations of the third embodiment of the invention, portions of respective coils on the first lateral level are formed from both metallisation layer TM-1 and metallisation layer TM-2, as illustrated schematically in FIG. 18. Thus, the portions of the respective coils on the first lateral level may be made thicker in a direction parallel to the transverse axis. The feature of increased thickness of the portions of the coils results in a structure having an improved Q factor.

It will be appreciated by persons skilled in the art that advantages of embodiments of the present invention may be obtained from structures according to the invention that have dimensions different to those of the embodiments described herein. Dimensions provided are for the purposes of illustration and are not intended to be limiting. A skilled person will appreciate that the number of turns of each coil, the width, thickness and length of the conducting elements forming the turns, and the spacing between the conducting elements of adjacent turns, are variables that can be changed to obtain the desired inductance, Q factor and resonant frequency. Other parameters, including the materials from which the conducting elements and the insulating media between conducting elements are fabricated may all be varied as required.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. An integrated transformer structure, comprising:
   a first coil element associated with a transverse axis, wherein the transverse axis is generally normal to at least first and second lateral levels mutually spaced apart along the transverse axis, the first coil element having at least one turn, the first coil element comprising a first portion provided on the first lateral level, and a second portion provided on the second lateral level, the first and second portions being displaced laterally from the axis by different respective distances; and
   at least one crossover element of the first coil element, the crossover element is disposed between the first and second lateral levels, wherein the crossover element is in a crossover plane which is parallel to planes of the first and second lateral levels, wherein the first coil element is configured to provide a conducting path through the first portion of the first coil element, through the crossover element and through the second portion of the first coil element, in which any change of flow direction along the path is less than 90° in a lateral direction.

2. The structure as claimed in claim 1 further comprising a second coil element associated with said transverse axis, the second coil element having at least one turn comprising a first portion formed on the first lateral level, and a second portion formed on the second lateral level, the first and second portions being laterally offset from one another with respect to said transverse axis.

3. The structure as claimed in claim 2 comprising at least one crossover element of the second coil element, the second coil element being configured to provide a conducting path through at least a portion of the first portion of the second coil element to the crossover portion, through the crossover element and subsequently through at least a portion of the second portion of the second coil element, in which any change of flow direction is less than 90° in a lateral direction.

4. The structure as claimed in claim 3 wherein the first and second coil elements are arranged to provide electromagnetic coupling between the coil elements along a portion of a length of at least one coil element in both a lateral and a transverse direction.

5. The structure as claimed in claim 1 wherein the first coil element comprises a plurality of turns.

6. The structure as claimed in claim 2 wherein the second coil element comprises a plurality of turns.

7. The structure as claimed in claim 6 wherein the first coil element comprises a plurality of turns.

8. The structure as claimed in claim 7 wherein at least one turn of each of said first and second coils comprises:

a first portion provided on a first lateral level, and a second portion provided on a second lateral level, the first and second lateral levels being mutually spaced apart along said transverse axis, the first and second portions being displaced laterally from said axis by different distances, and at least one crossover element, each of the at least one turns being configured to provide a conducting path through at least a portion of the first portion to the crossover element, through the crossover element and subsequently through at least a portion of the second portion, in which any change of flow direction along said path is less than 90° in a lateral direction.

9. The structure as claimed in claim 8 wherein said first and second portions of said at least one turns each comprise substantially half a turn of said coil element.

10. The structure as claimed in claim 9 wherein each of turn of said at least one turn of the first and second coils further comprises third and fourth portions.

11. The structure as claimed in claim 10 wherein each of the first and fourth portions of the at least one turn are laterally offset from the common transverse axis by a different distance than the second and third portions of each coil.

12. The structure as claimed in claim 11 wherein said first and third portions of said at least one turn of each coil are provided on a different lateral level to the second and fourth portions.

13. The structure as claimed in claim 12 wherein said first and third portions of said at least one turn of each coil are in diametrically opposed spaced relationship about the common axis.

14. The structure as claimed in claim 13 wherein said first, second, third and fourth portions of said at least one turn of said coils each comprise generally one quarter of a turn.

15. The structure as claimed in claim 1 wherein each coil element comprises two turns.

16. The structure as claimed in claim 1 wherein each coil element comprises four turns.

17. The structure as claimed in claim 1 wherein said turns are substantially symmetrical.

18. The structure as claimed in claim 1 wherein the first coil element is arranged such that no portions of the first coil element are in mutually confronting relationship along a direction parallel to said transverse axis.

19. The structure as claimed in claim 2 wherein the first coil element comprises a plurality of turns arranged such that adjacent concentric portions of the turns on a given lateral level are separated by a portion of a turn of the second coil element.

20. An integrated transformer structure comprising:

a first coil element associated with a transverse axis, the first coil element having at least one turn, the first coil element comprising a first portion provided on a first lateral level, and a second portion provided on a second lateral level, the first and second lateral levels being mutually spaced apart along said transverse axis, the first and second portions being displaced laterally from said axis by different respective distances; and at least one crossover element of the first coil element, the crossover element is located in between the first and second lateral levels, wherein the crossover element is in a crossover plane which is parallel to planes of the first and second lateral levels, wherein the first coil element being configured to provide a conducting path through at least a portion of the first portion of the first coil element to the crossover element, through the crossover element and subsequently through at least a portion of the second portion of the first coil element, in which any change of flow direction along said path is less than 90° in a lateral direction, wherein a via element is provided, the via element being configured to provide a flowpath between the crossover element and a portion of a coil element associated with the crossover element.

21. The structure as claimed in claim 20 wherein a via element associated with a crossover element of the first coil element is displaced from a corresponding via element associated with a crossover element of the second coil element along a transverse direction and not along a lateral direction.

22. The structure as claimed in claim 20 wherein a via element associated with a crossover element of the first coil element is displaced from a corresponding via element associated with a crossover element of the second coil element along both a transverse direction and a lateral direction.

23. The structure as claimed in claim 1 comprises a via element, the via element being configured to provide a flowpath between the crossover element and a portion of the first coil element associated with the crossover element.

24. The structure as claimed in claim 23 wherein the via element associated with the crossover element of the first coil element is displaced along a transverse direction and not along a lateral direction.

25. The structure as claimed in claim 3 comprises a via element, the via element being configured to provide a flowpath between the crossover element and a portion of the second coil element associated with the crossover element.

26. The structure as claimed in claim 25 wherein the via element associated with the crossover element of the first coil element is displaced from the corresponding via element associated with the crossover element of the second coil element along a transverse direction and not along a lateral direction.

27. The structure as claimed in claim 26 wherein the via element associated with the crossover element of the first coil element is displaced from the corresponding via element associated with the crossover element of the second coil element along both a transverse direction and a lateral direction.

28. A transformer structure comprising:
   a first coil element comprising first and second coil portions;
   a first lateral level on which the first coil portion is disposed;
   a second lateral level on which a second coil portion is disposed, wherein the first and second portions are offset laterally from a transverse axis by different distances;
   at least one crossover element, the crossover element is disposed between the first and second lateral levels, wherein the crossover element is in a crossover plane which is parallel to planes of the first and second lateral levels; and
   wherein the first coil element is configured to provide a first coil conducting path through the first portion of the first coil element, through the crossover element and through the second portion of the first coil element.

29. The transformer structure of claim 28 wherein any change in the first coil conducting path is less than 90° in a lateral direction.

30. The structure of claim 28 further comprising a second coil element, the second coil element having at least one turn comprising a first portion formed on the first lateral level, and a second portion formed on the second lateral level, the first and second portions being laterally offset from the transverse axis by different distances.

31. The structure of claim 30 comprising at least one crossover element for the second coil element, wherein the second coil element is configured to provide a second coil conducting path through the first portion of the second coil element, through the crossover element and through the second portion of the second coil element.

32. The transformer structure of claim 31 wherein any change in the second conducting path is less than 90° in a lateral direction.

* * * * *